US008656232B2

(12) United States Patent  
Tanefusa et al.

(10) Patent No.: US 8,656,232 B2
(45) Date of Patent: Feb. 18, 2014

(54) APPARATUS AND METHOD FOR TESTING SEMICONDUCTOR INTEGRATED CIRCUITS, AND A NON-TRANSITORY COMPUTER-READABLE MEDIUM HAVING A SEMICONDUCTOR INTEGRATED CIRCUIT TESTING PROGRAM

(75) Inventors: Yusuke Tanefusa, Yokohama (JP); Kenichi Gomi, Yokohama (JP); Satoshi Yokoo, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 202 days.

(21) Appl. No.: 13/019,831

(22) Filed: Feb. 2, 2011

(65) Prior Publication Data

US 2011/0219276 A1 Sep. 8, 2011

(30) Foreign Application Priority Data

Mar. 8, 2010 (JP) ................................ 2010-051120

(51) Int. Cl.
*G01R 31/28* (2006.01)
(52) U.S. Cl.
USPC .......................................... 714/724; 714/742
(58) Field of Classification Search
USPC .................................................. 714/724, 742
See application file for complete search history.

(56) References Cited

U.S. PATENT DOCUMENTS

| 4,369,511 | A | * | 1/1983 | Kimura et al. ................ 714/719 |
| 4,821,238 | A | * | 4/1989 | Tatematsu ..................... 365/201 |
| 5,157,644 | A | * | 10/1992 | Rokutan .................... 369/44.11 |
| 6,161,206 | A | * | 12/2000 | Wasson ......................... 714/738 |
| 7,225,372 | B2 | * | 5/2007 | Suzuki et al. ................. 714/720 |
| 7,266,738 | B2 | * | 9/2007 | Sato .............................. 714/718 |
| 7,275,187 | B2 | * | 9/2007 | Kawasaki ..................... 714/718 |
| 7,793,175 | B1 | * | 9/2010 | Swarnkar et al. ............. 714/718 |
| 8,120,867 | B2 | * | 2/2012 | Brady et al. .................... 360/31 |
| 2003/0074153 | A1 | | 4/2003 | Sugamori et al. |
| 2005/0073332 | A1 | | 4/2005 | Sato |

FOREIGN PATENT DOCUMENTS

| JP | 54-52933 A | 4/1979 |
| JP | 05-074199 A | 3/1993 |
| JP | 11-149795 A | 5/1999 |
| JP | 2003-196991 A | 7/2003 |
| JP | 2004-199827 A | 7/2004 |
| JP | 2006-338797 A | 12/2006 |

OTHER PUBLICATIONS

European Search Report dated Jun. 20, 2011.
JP Office Action dated Oct. 15, 2013 issued from JP Application No. 2010-051120, 2 pages.

* cited by examiner

*Primary Examiner* — Esaw Abraham
(74) *Attorney, Agent, or Firm* — Arent Fox LLP (57) ABSTRACT

An apparatus for testing a semiconductor integrated circuit includes a pattern data generating unit configured to generate test pattern data for testing a write operation in a memory of the semiconductor integrated circuit; and a write unit configured to write the test pattern data into a storage area of the semiconductor integrated circuit.

10 Claims, 6 Drawing Sheets

| %%%%%%%%% | CYC | ADDRESS 2 | ADDRESS 1 | ADDRESS 0 | PGM | %%%%%%%%% | LINES |
|---|---|---|---|---|---|---|---|
| | 100ns | 0 | 0 | 0 | 0 | | 1 |
| | 100ns | 0 | 0 | 1 | 0 | | 2 |
| | 100ns | 0 | 1 | 0 | 0 | | 3 |
| | 100ns | 0 | 1 | 1 | 0 | | 4 |
| | 100ns | 1 | 0 | 0 | 0 | | 5 |
| | 100ns | 1 | 0 | 1 | 0 | | 6 |
| | 100ns | 1 | 1 | 0 | 0 | | 7 |
| | 100ns | 1 | 1 | 1 | 0 | | 8 |

FIG.2B

| %%% | ADD | PAD | INIT | PGM | CYC | %%% |
|---|---|---|---|---|---|---|
| | 0 | 1 | 0 | 1 | 1μs | |
| | 1 | 1 | 0 | 1 | 1μs | |
| | 2 | 1 | 0 | 1 | 1μs | |
| | 3 | 1 | 0 | 1 | 1μs | |
| | 4 | 1 | 0 | 1 | 1μs | |
| | 5 | 1 | 0 | 1 | 1μs | |
| | 6 | 1 | 0 | 1 | 1μs | |
| | 7 | 1 | 0 | 1 | 1μs | |

FIG.2C

| %%% | DEF | LOT | WAF | CHIP | ADD | %% |
|---|---|---|---|---|---|---|
| | 0 | XX-XXXX | 10 | 1 | 0 | |
| | 1 | XX-XXXX | 10 | 1 | 1 | |
| | 0 | XX-XXXX | 10 | 1 | 2 | |
| | 0 | XX-XXXX | 10 | 1 | 3 | |
| | 0 | XX-XXXX | 10 | 1 | 4 | |
| | 0 | XX-XXXX | 10 | 1 | 5 | |
| | 1 | XX-XXXX | 10 | 1 | 6 | |
| | 0 | XX-XXXX | 10 | 1 | 7 | |

APPARATUS AND METHOD FOR TESTING SEMICONDUCTOR INTEGRATED CIRCUITS, AND A NON-TRANSITORY COMPUTER-READABLE MEDIUM HAVING A SEMICONDUCTOR INTEGRATED CIRCUIT TESTING PROGRAM

CROSS-REFERENCE TO RELATED APPLICATIONS

This application is based upon and claims the benefit of priority of Japanese Patent Application 2010-051120, filed on Mar. 8, 2010, the entire contents of which are incorporated herein by reference.

FIELD

The present invention relates to the testing of semiconductor integrated circuits.

BACKGROUND

In a conventional semiconductor chip having a non-volatile memory that can be written into once, a write pattern for operating a test circuit implemented within the chip is stored in the non-volatile memory in advance. When a PROM (Programmable Read Only Memory) that can be written into once is built inside a chip as a OTP (One Time Programmable) memory used for an encryption key, for example, the cells written into need to be varied from one chip to another because the PROM is used for the encryption key. Thus, conventionally, a write circuit is separately provided, so that the write pattern data can be varied from one chip to another. As a result, the man-hours for designing the test circuit built inside the chip and the area for macros increase.

In order to reduce the man-hours required for designing the test circuit and the area required by macros, the write pattern data may be externally generated and written into the chip at the time of testing the chip. From the viewpoint of writing the write pattern data into the chip from the outside, Patent Document 1 proposes writing data in a predetermined order so that the influence of heat, for example, caused by the write operation is not localized. Patent Document 2 proposes adjusting the duration of time for writing data depending on the volume of the written data. Patent Document 3 proposes providing memories separately for common data and individual data so that either the common data or individual data can be designated.

Patent Document 1 JP54-052933A
Patent Document 2 JP2003-196991A
Patent Document 3 JP2004-199827A

SUMMARY

In one aspect, the invention may provide an apparatus for testing a semiconductor integrated circuit which includes a pattern data generating unit that generates test pattern data for testing a write operation in a memory of the semiconductor integrated circuit; and a write unit that writes the test pattern data into a storage area of the semiconductor integrated circuit.

In another aspect, the invention may provide a method of testing a semiconductor integrated circuit by causing a computer to perform generating test pattern data for testing a write operation in a memory of the semiconductor integrated circuit; and writing the test pattern data into a storage area of the semiconductor integrated circuit.

In another aspect, the invention may provide a non-transitory computer-readable recording medium having a computer-executable program for causing a computer to function as an apparatus for testing a semiconductor integrated circuit. The computer includes a first storage area in which test target information designating the semiconductor integrated circuit as a test target is stored; and a second storage area in which a non-operation condition table, an operation condition table, and a definition table are stored. The non-operation condition table includes address information of all of the bits of a memory of the semiconductor integrated circuit and sets a non-operation condition for all of the bits. The operation condition table sets an operation condition for all of the bits. The definition table associates LSI-identifying information that identifies the semiconductor integrated circuit with bit-specifying information that specifies an operation target bit of the memory. The computer-executable program causes the computer to perform acquiring operation target bit information corresponding to the test target information stored in the first storage area from the definition table; acquiring an operation condition for the operation target bit information from the operation condition table; merging the operation condition for the operation target bit information with the non-operation condition table in order to generate test pattern data; and writing the test pattern data into a storage area of the semiconductor integrated circuit.

The object and advantages of the disclosure will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

A complete understanding of the present invention may be obtained by reference to the accompanying drawings, when considered in conjunction with the subsequent, detailed description, in which.

DESCRIPTION OF EMBODIMENTS

In the related art, because the pattern data provided within an LSI chip in advance are for the testing of a write operation, the pattern data need to designate a write bit (address). Further, because the written cells need to be varied from one chip to another in the case of storing an encryption key as mentioned above, the prepared write data cannot be commonly written in all of the chips in a uniform manner.

Figure 1:
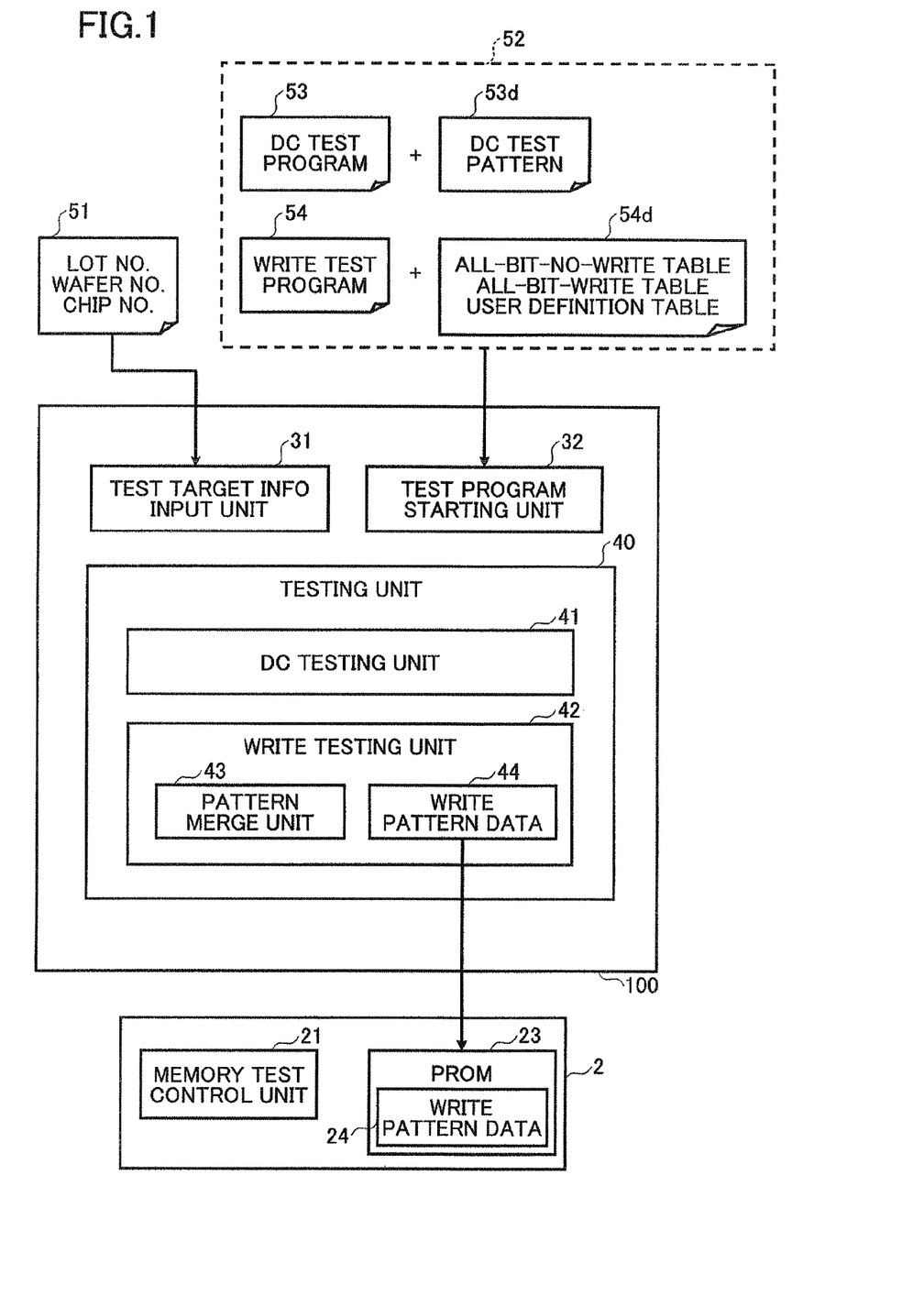
FIG. 1 is a functional block diagram of a testing apparatus and a semiconductor chip tested by the testing apparatus.

Referring now to the drawings, wherein like reference numerals designate identical or corresponding parts throughout the several views, FIG. 1 is a functional block diagram of a testing apparatus 100 for testing a chip 2 (semiconductor integrated circuit). The testing apparatus 100 includes a test information input unit 31, a test program activating unit 32, and a testing unit 40. The functions of the test information input unit 31, the test program activating unit 32, and the testing unit 40 may be provided by causing a CPU (central processing unit; not shown in FIG. 1) to execute a control program, as will be described later.

The test information input unit 31 is configured to receive and supply test target information 51 designating a test target to the testing unit 40. The test target information 51 includes a lot number, a wafer number, and a chip number, either individually or in combination. The lot number may be specified without designating the wafer number or the chip number; or the lot number and the wafer number may be specified without specifying the chip number. When the chip number alone is designated, the lot and the wafer may not be limited.

The test program activating unit 32 loads test execution information 52 into a storage area of the testing apparatus 100 and then causes the testing unit 40 to initiate a test. The test execution information 52 includes a DC test program 53; a DC test pattern 53d used in the DC test; a write test program 54; and pattern generating data 54d.

The testing unit 40 includes a DC testing unit 41 and a write testing unit 42. The DC testing unit 41 is realized upon execution of the DC test program 53 by the CPU. The write testing unit 42 is realized upon execution of the write test program 54 by the CPU. The write testing unit 42 includes a pattern merge unit 43. The pattern merge unit 43 generates write pattern data 44 by merging an all-bit-no-write table, an all-bit-write table, and a user definition table which are included in the pattern generating data 54d in the test execution information 52 as will be described in detail later. The write pattern data 44 is stored in a storage area of the testing apparatus 100.

When executing a write test for the chip 2, the write testing unit 42 writes the write pattern data 44 generated by the pattern merge unit 43 in a predetermined storage area of a PROM 23 of the chip 2 as write pattern data 24. The chip 2 includes a memory test control unit 21 as well as the PROM 23. The memory test control unit 21 performs a memory test using the write pattern data 24 written in the PROM 23.

Figure 2A:
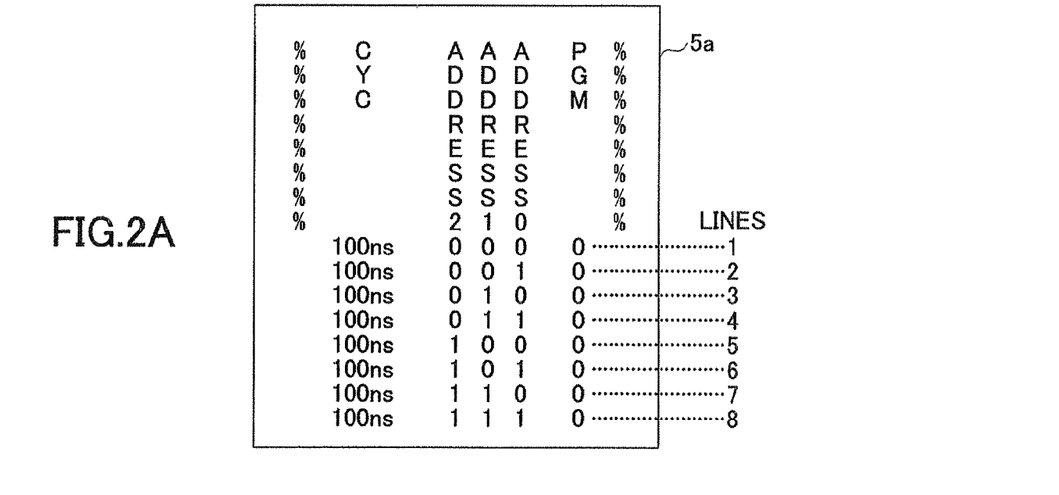
FIGS. 2A, 2B, and 2C illustrate examples of pattern generating data.
Figure 2B:
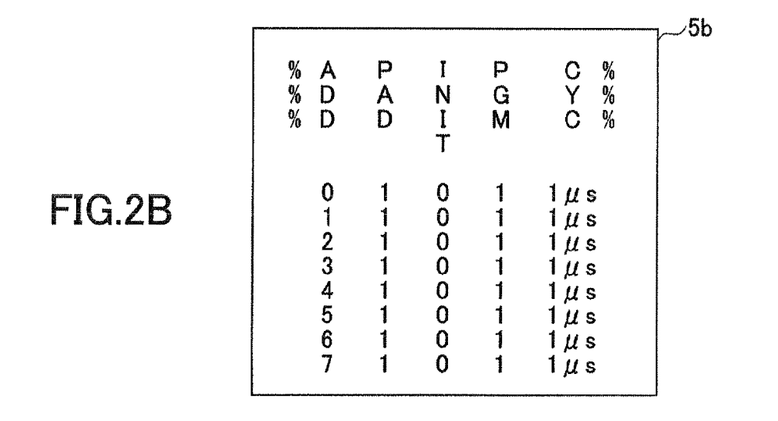
Figure 2C:
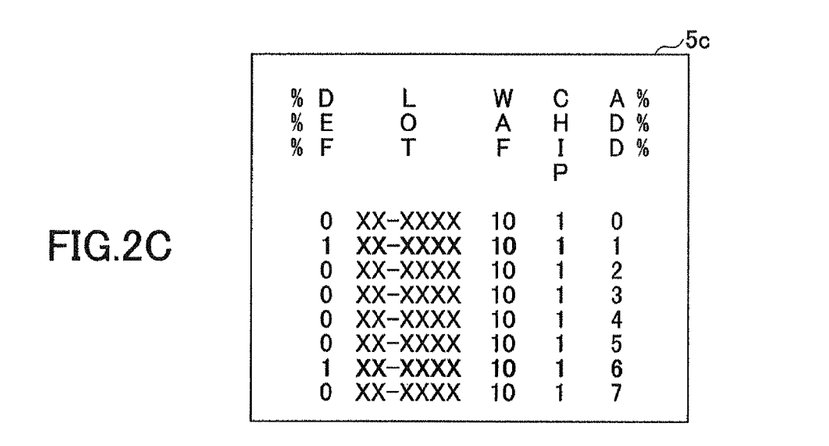

FIGS. 2A, 2B, and 2C illustrate an all-bit-no-write table 5a, an all-bit-write table 5b, and a user definition table 5c, respectively, which are included in the pattern generating data 54d for generating the write pattern data 24. The all-bit-no-write table 5a of FIG. 2A is a default definition table of a pattern (which may be hereafter referred to as a "no-write pattern") for not writing in any bits (lines 1 through 8). The all-bit-no-write table 5a has the items of "CYC", "ADDRESS", and "PGM". "CYC" indicates cycle times for delivering the no-write pattern. "ADDRESS" indicates the addresses of the lines 1 through 8 of the no-write pattern in three bits of binary numbers "b'000" through "b'111" (bit 0 through bit 7). "PGM" indicates the values of PGMCMD signals in the case of a no-write operation. The PGMCMD signal indicates "1" for a write operation and "0" for a no-write operation. In the example of FIG. 2A, the all-bit no-write pattern is defined such that the CYC time is 100 ns and the PGM signal is "0", indicating that none of the bits from bit 0 through bit 7 designated by ADDRESS have been written in.

The all-bit-write table 5b of FIG. 2B is a default definition table of a pattern (which may be hereafter referred to as a "write pattern") for writing in all of the bits. The all-bit-write table 5b has items of ADD, PAD, INIT, PGM, and CYC. "ADD" designates an address count of the write pattern in decimal numbers, indicating which line is to be written. "PAD" designates terminal numbers of the PGMCMD signals. "INIT" designates values of the PGMCMD signals for a no-write operation. "PGM" indicates a value of the PGMCMD signals for a write operation. "CYC" designates the cycle time for the delivery of the no-write pattern. In the example of FIG. 2B, the numbers "0" through "7" of ADD correspond to the lines 1 through 8 of the all-bit-no-write table 5a of FIG. 2A. "PAD" designates the terminal number "1". "INIT" designates the value of "0" of the PGMCMD signal for a no-write operation. "PGM" indicates the value of "1" for the PGMCMD signal for a write operation. "CYC" indicates "1 µs".

The user definition table 5c of FIG. 2C is provided by a user who designed and developed the chip 2 as the test target. The user definition table 5c indicates the need for a write operation. The user definition table 5c includes items for DEF, LOT, WAF, CHIP, and ADD. "DEF 0" indicates a no-write operation and "DEF 1" indicates a write operation. "LOT" designates the lot number; "LOT 0" indicates that the lot is not specified. "WAF" designates a wafer number; "WAF 0" indicates that the wafer is not specified. "CHIP" designates a chip number; "CHIP 0" indicates that the chip is not specified. "ADD" corresponds to the item ADD of the all-bit-write table 5b illustrated in FIG. 2B. Thus, "write" or "no-write" is specified for each of the combinations (bits "0" through "7" designated by ADD) of the lot number, the wafer number, and the chip number. In the example of FIG. 2C, CHIP "1" of WAF "10" of LOT "XX-XXXX" is designated, and a write operation is specified for ADDs "1" and "6" by DEF "1".

The all-bit-no-write table 5a of FIG. 2A and the all-bit-write table 5b of FIG. 2B may be prepared by a testing party. On the other hand, the user definition table 5c of FIG. 2C may be defined and provided to the tested side by a client.

Figure 3:
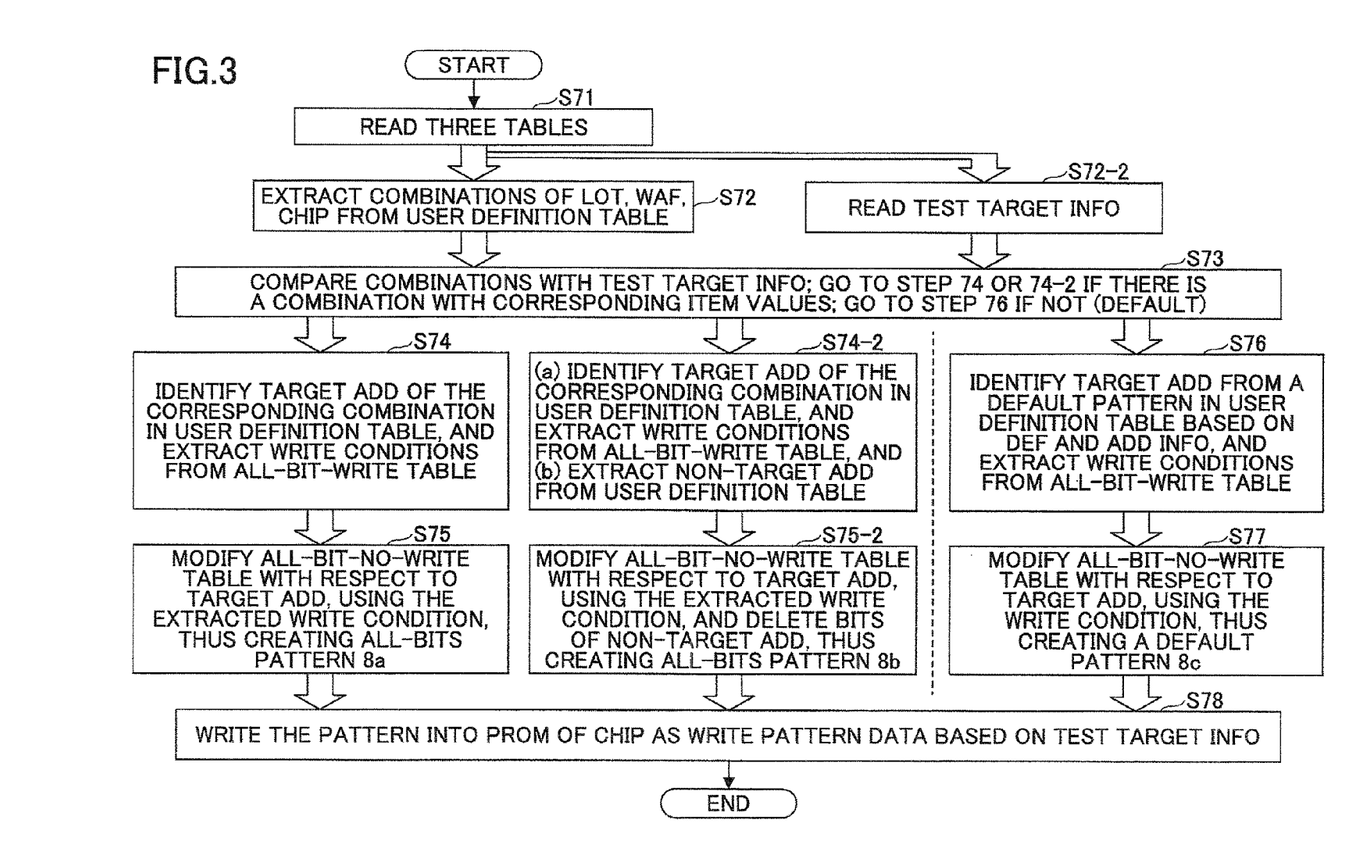
FIG. 3 is a flowchart of a pattern merge process.
Figure 4:
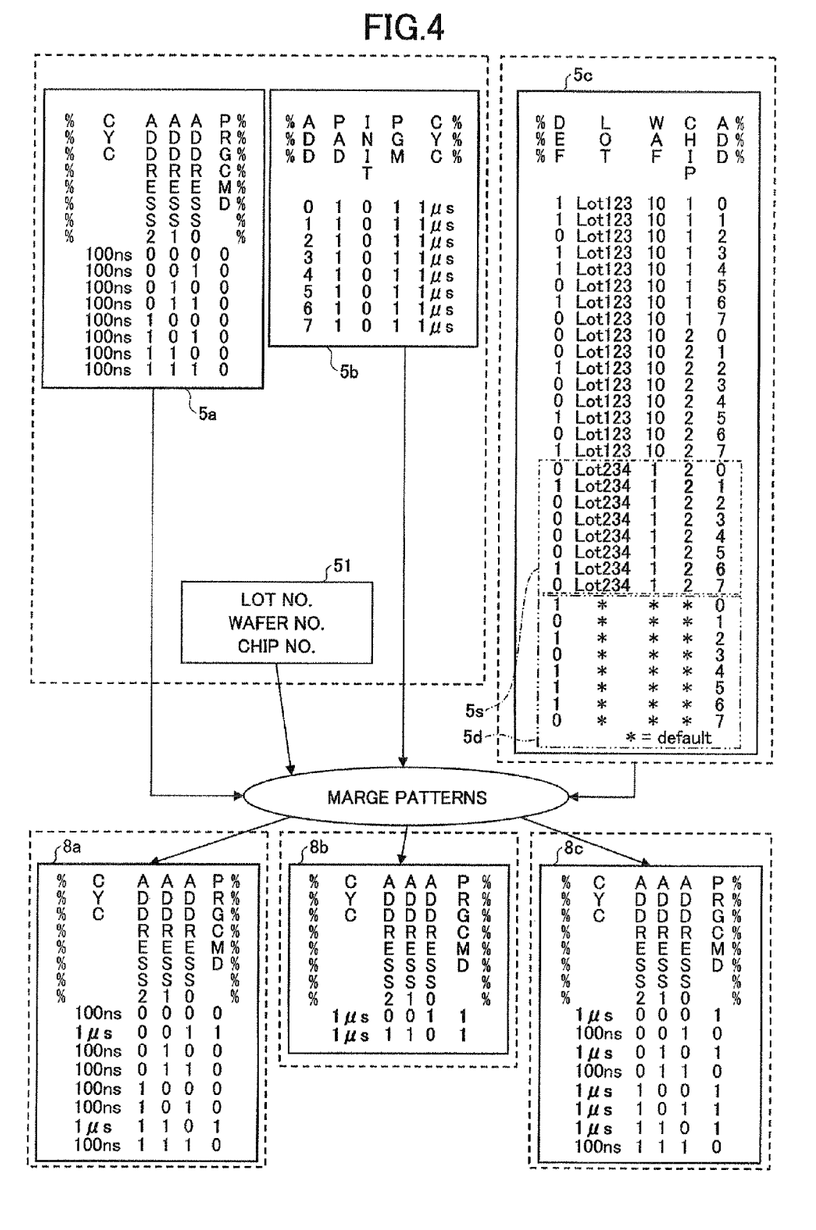
FIG. 4 illustrates an example of the pattern merge process.

FIG. 3 is a flowchart of a pattern merge process performed by the pattern merge unit 43 of the write testing unit 42 using the above three kinds of tables. FIG. 4 illustrates a concrete example of the pattern merge process. Referring to FIG. 3, the testing unit 40 reads the three tables of the pattern generating data 54d loaded and stored in the storage area (step S71). Specifically, the all-bit-no-write table 5a, the all-bit-write table 5b, and the user definition table 5c illustrated in FIG. 4 are read.

The testing unit 40 then extracts all of the combinations of the values of LOT, WAF, and CHIP from the user definition table 5c included in the pattern generating data 54d (step S72). In the example of FIG. 4, the combinations of (LOT, WAF, CHIP) include (123, 10, 1), (123, 10, 2), and (234, 1, 2). The testing unit 40 reads the test target information 51 stored in the storage area (step S72-2). The testing unit 40 compares the combinations of (LOT, WAF, CHIP) extracted in step S72 with the test target information 51 read in step S72-2. If there is a combination having the corresponding item values, the routine proceeds to step S74 or step S74-2. If there is no corresponding combination, a default pattern 5d is acquired from the user definition table 5c (step S73).

The selection of step S74 or step S74-2 corresponds to the selection of an all-bits pattern 8a or a target-bits pattern 8b in FIG. 4. Either step S74 or step S74-2 may be selected at the time of designing the program for the pattern merge process. Alternatively, the all-bits pattern 8a or the target-bits pattern 8b may be selected at the time of reading the test target information 51 or the test execution information 52 into the testing apparatus 100.

First, a process of generating the all-bits pattern 8a is described with reference to steps S74 and S75. The testing unit 40 acquires from the user definition table 5c a pattern with the item values corresponding to those of the combinations (LOT, WAF, CHIP) extracted in step S72. The testing unit 40 identifies the ADD of the combinations from the user definition table 5c having DEF "1" indicating write targets, and then extracts the write conditions for the combinations with the identified ADD from the all-bit-write table 5b (step S74).

For example, when the test target information 51 designates lot No. 234, wafer No. 1, and chip No. 2, a pattern 5s indicating the corresponding combinations (LOT=234, WAF=1, CHIP=2) is read from the user definition table 5c of FIG. 4. Then, ADDs "1" and "6" where DEF is "1" are identified. Then, the write conditions for the corresponding ADD "1" and "6" are extracted from the all-bit-write table 5b of FIG. 4. Specifically, the values of CYC and PGM are extracted from the all-bit-write table 5b of FIG. 4 as the write conditions. More specifically, with regard to ADD "1" and "6", CYC "1 ps" and PGM "1" are extracted.

Thereafter, the testing unit 40 modifies the item values of the all-bit-no-write table 5a with respect to the write target ADD, using the write conditions extracted in step S74, thereby generating the all-bits pattern 8a (step S75). Thus, with regard to ADD "1" and "6", the all-bits pattern 8a indicates CYC is "1 μs " and PGM is "1". The all-bits pattern 8a of FIG. 4 is then outputted to a storage area for the write pattern data 44 (FIG. 1).

The testing unit 40 then writes the all-bits pattern 8a stored in the write pattern data 44 in the PROM 23 of the chip 2 as the write pattern data 24 based on the test target information 51, thereby completing the pattern merge process (step S78).

Next, a process of generating the target-bits pattern 8b is described with reference to steps S74-2 and S75-2. The testing unit 40 acquires from the user definition table 5c a pattern with the item values corresponding to those of the combinations (LOT, WAF, CHIP) extracted in step S72. Then, the testing unit 40 (a) identifies the ADDs of the acquired combinations (write targets) indicating DEF "1",and extracts the write conditions for the identified ADDs from the all-bit-write table 5b; and (b) extracts the ADDs of no-write targets indicating DEF "0" (step S74-2).

Thus, in the example of FIG. 4, by the process (a), in the case where lot No. 234, wafer No. 1, and chip No. 2 are designated in the test target information 51, the pattern 5s of the corresponding combination (LOT=234, WAF=1, CHIP=2) is read from the user definition table 5c of FIG. 4, and ADDs "1" and "6" indicating DEF "1" are identified as the write targets. Then, the write conditions for the target ADD "1" and "6" are extracted from the all-bit-write table 5b of FIG. 4. In this case, the values of CYC and PGM are extracted as the write conditions from the all-bit-write table 5b of FIG. 4. Specifically, regarding ADDs "1" and "6", CYC of "1 μs" and PGM of "1" are extracted. By the process (b), ADD "0", ADDs "2" through "5", and ADD "7", which all indicate DEF "0" in the pattern 5s, are extracted as the non-targets.

After the process of step S74-2, the testing unit 40 modifies the item values of the all-bit-no-write table 5a with respect to the write target ADDs using the write conditions extracted in step S74-2, and deletes the bits corresponding to the write non-target ADDs (step S75-2). Namely, the all-bit-no-write table 5a of FIG. 4 is modified such that CYC is "1 μs" and PGM is "1" with respect to ADDs "1" and "6", while the bits for ADD "0", ADDs "2" through "5", and ADD "7" are deleted, thereby producing the target-bits pattern 8b of FIG. 4. The target-bits pattern 8b is then outputted to a storage area for the write pattern data 44 (FIG. 1).

Based on the test target information 51, the testing unit 40 writes the target-bits pattern 8b stored in the write pattern data 44 in the PROM 23 of the chip 2 as the write pattern data 24, thereby completing the pattern merge process (step S78).

On the other hand, if it is determined in step S73 that there is no corresponding combination between the combinations (LOT, WAF, CHIP) extracted in step S72 and the test target information 51 read in step S73, steps S76 and S77 are executed. In step S76, the testing unit 40, using only the information of DEF and ADD from the default pattern 5d in the user definition table 5c, identifies the ADD of write targets with DEF "1", and extracts the corresponding write conditions from the all-bit-write table 5b. Specifically, from the default pattern 5d of FIG. 4, the ADDs "0", "2", "4", "5", and "6" of the write targets with DEF "1" are identified, and CYC "1 μs" and PGM "1" for the identified ADD are extracted from the all-bit-write table 5b.

Then, the testing unit 40, using the write conditions extracted in step S76, modifies the item values of the all-bit-no-write table 5a with respect to the write target ADDs, thereby generating a write default pattern 8c (step S77) such that CYC is "1 μs" and PGM is "1". The write default pattern 8c of FIG. 4 is then outputted to a storage area of the write pattern data 44 (FIG. 1). Based on the test target information 51, the testing unit 40 writes the write default pattern 8c stored in the write pattern data 44 in the PROM 23 of the chip 2 as the write pattern data 24, thereby completing the pattern merge process (step S78).

Figure 5:
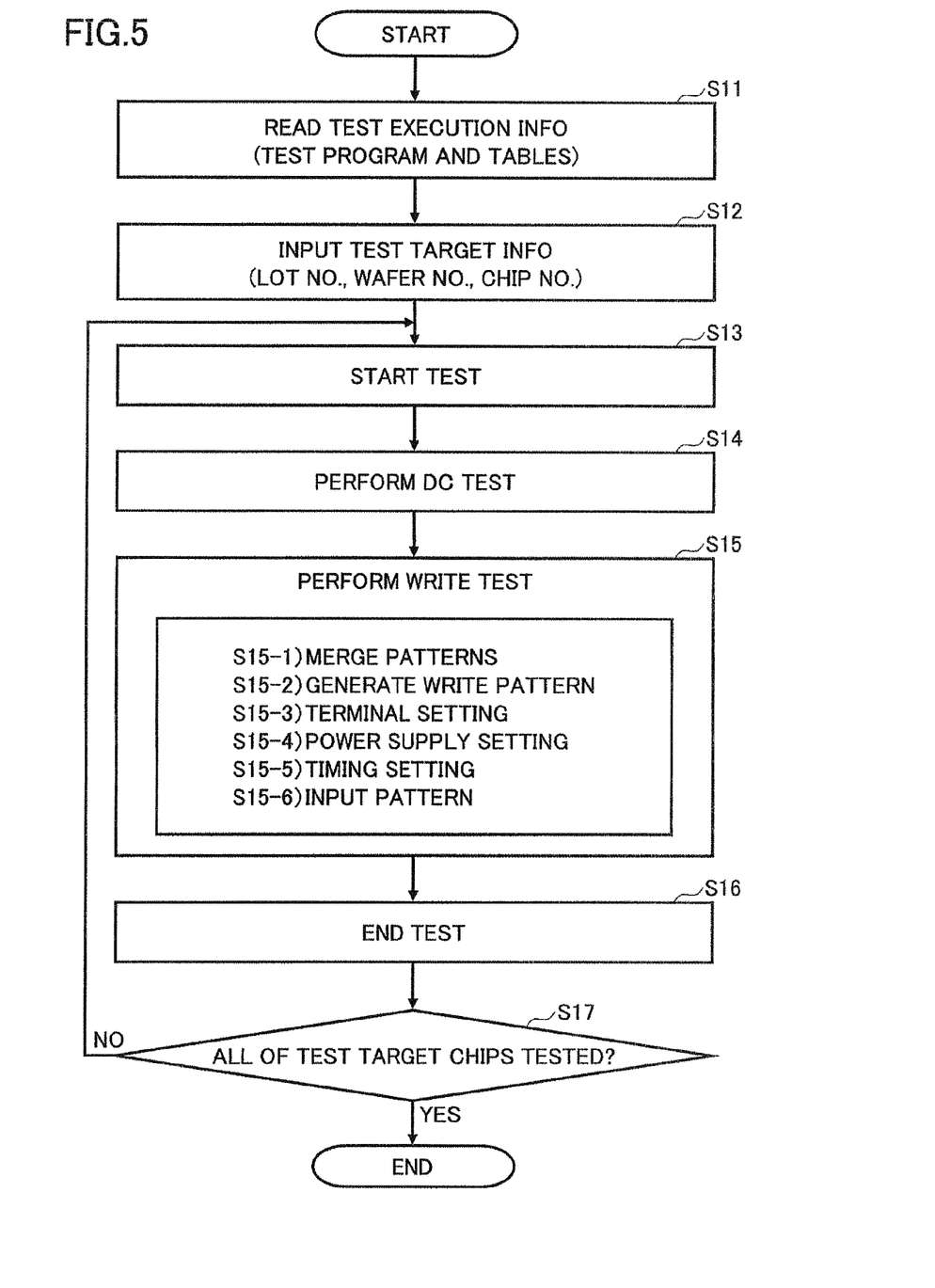
FIG. 5 is a flowchart of an overall process performed by the testing apparatus.

FIG. 5 is a flowchart of an overall process performed by the testing apparatus 100 including the above-described pattern merge process. The testing apparatus 100 reads the test execution information 52 into the storage area using the test program activating unit 32 (step S11). The test execution information 52 includes the DC test program 53, the DC test pattern 53d, the write test program 54, and the pattern generating data 54d.

The testing apparatus 100 also reads the test target information 51 into the storage area using the test target information input unit 31 (step S12). The test target information 51 includes the designated lot number, wafer number, and chip number.

The testing apparatus 100, by referring to a measurement map associating the chip number with the XY coordinates on the wafer, identifies the XY coordinates of the chip number on the wafer designated by the test target information 51, and then causes the testing unit 40 to perform a test (step S13). Specifically, in the testing unit 40, first the DC testing unit 41 is activated by the execution of the DC test program 53 for the chip 2 designated by the XY coordinates, and the DC test is conducted for the chip 2 (step S14). Thereafter, the write test program 54 is executed, whereby the write testing unit 42 is activated and a write test is conducted for the chip 2 (step S15).

The write test conducted in step S15 is described. The write testing unit 42 executes the pattern merge process as described above with reference to FIG. 3 based on the test target information 51 (step S15-1), thereby generating the write pattern data 44 (step S15-2). After a terminal setting for the chip 2 (step S15-3), a power supply setting (step S15-4), and a timing setting (step S15-5), the write testing unit 42 inputs the write pattern data 44 generated in step S15-2 into the PROM 23 of the chip 2 as the write pattern data 24 (step S15-6), and then a write test is executed within the chip 2.

Upon reception of a write test completion notice from the write testing unit 42 (step S16), the testing unit 40 determines whether the test has been completed for all of the test target chips (step S17) based on the test target information 51. If there is at least one chip that has not been tested, the testing unit 40 repeats the above process for the chip from step S13. On the other hand, if all of the test target chips have been tested, the test process is completed.

Figure 6:
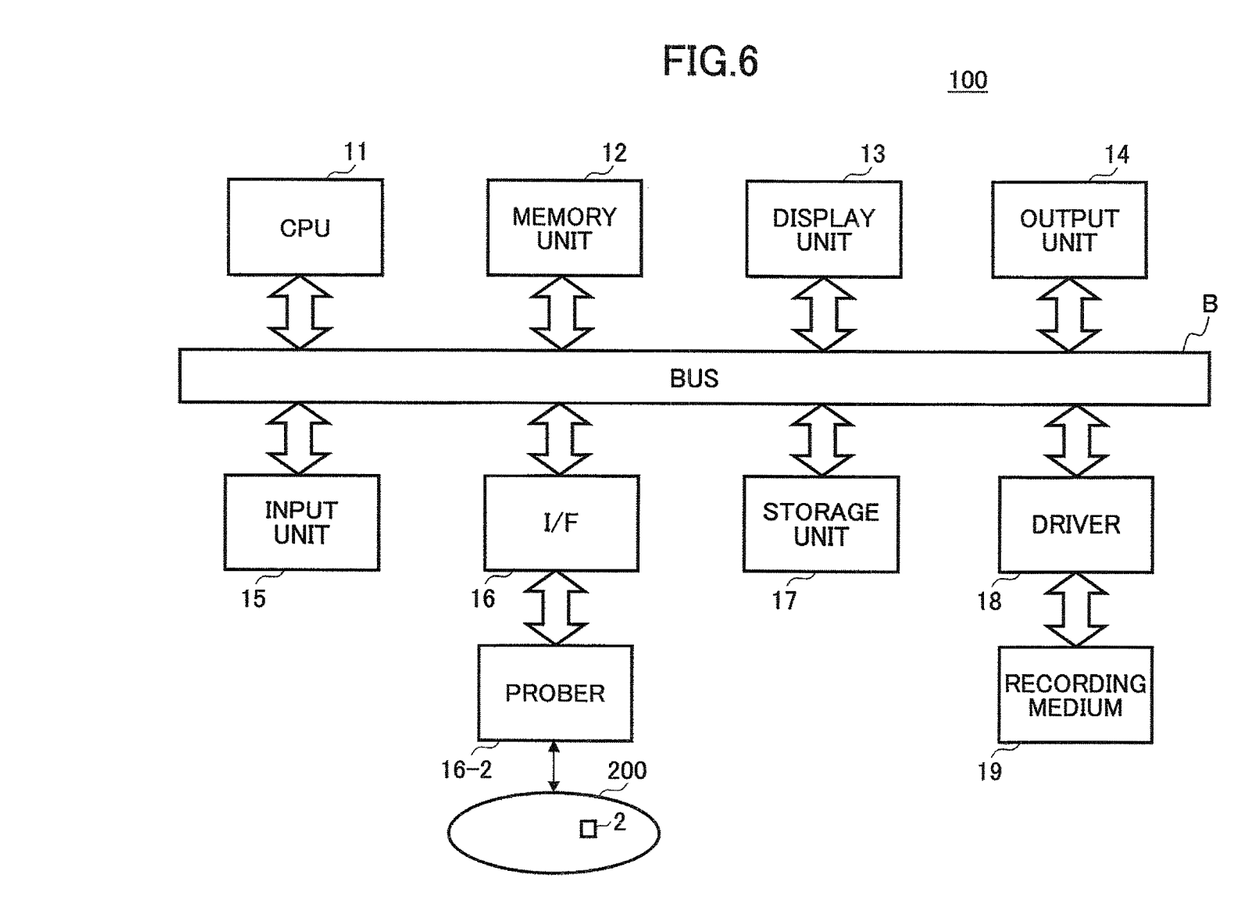
FIG. 6 illustrates a hardware structure of the testing apparatus.

FIG. 6 is a block diagram of a hardware structure of the testing apparatus 100. The testing apparatus 100, which may include a terminal controlled by a computer, includes a CPU (Central Processing Unit) 11, a memory unit 12, a display unit 13, an output unit 14, an input unit 15, an interface (I/F) 16, a storage unit 17, and a driver 18, which are connected via a system bus B.

The CPU 11 may be configured to control the testing apparatus 100 in accordance with a program stored in the memory unit 12. The memory unit 12, which may include a RAM (Random Access Memory) or a ROM (Read-Only Memory), may be configured to store the program executed by the CPU 11 and data required for or obtained by a process by the CPU 11. A part of the memory unit 12 may be allocated for a work area for a process performed by the CPU 11.

The display unit 13 displays various information items under the control of the CPU 11. The output unit 14 may include a printer and is used for outputting various information items in accordance with an instruction from a testing staff member. The input unit 15 may include a mouse and keyboard and is used for the input of various information items from the testing staff so that the testing apparatus 100 can perform various processes. The I/F 16 enables connection via cable with a prober 16-2 on which a wafer 200 is mounted.

The storage unit 17, which may include a hard disk unit, stores programs and data for various processes. For example, the program for causing the CPU to provide the functions of the test target information input unit 31, the test program activating unit 32, and the testing unit 40 of the testing apparatus 100 of FIG. 1 is stored in the storage unit 17.

A program for realizing the processes performed by the testing apparatus 100 may be supplied to the testing apparatus 100 via a storage medium 19, which may include a CD-ROM (Compact Disc Read-Only Memory). For example, the CD-ROM is set on the driver 18, and the driver 18 reads the program from the CD-ROM and installs it in the storage unit 17 via the system bus B. Upon start-up, the CPU 11 starts executing the program installed in the storage unit 17. Such a storage medium is not limited to a CD-ROM and may include other computer-readable media.

The test target information 51 inputted via the input unit 15, for example, is stored in a storage area of the storage unit 17 or the memory unit 12. The test execution information 52 may also be stored in a storage area of the storage unit 17 or the memory unit 12 from the storage medium 19 via the driver 18.

The testing apparatus 100 causes the DC testing unit 41 to perform a DC test on a chip 2 of the wafer 200 mounted on the prober 16-2 in accordance with the chip number designated by the test target information 51. After writing the write pattern data 44 in the chip 2, the testing apparatus 100 causes the write testing unit 42 to perform a write test.

Thus, in accordance with the present embodiment, the write pattern data 44 for the chip 2 on which an OTP memory, such as PROM, is implemented, is generated by the testing apparatus 100. Thus, the chip 2 does not require the pattern generating circuit for generating the write pattern data. Thus, the man-hours for designing the pattern generating circuit and the area of macros can be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention.

Although the embodiments of the present inventions have been described in detail, it should be understood that the various changes, substitutions, and alterations could be made hereto without departing from the spirit and scope of the invention.

What is claimed is:

1. An apparatus for testing a semiconductor integrated circuit, the apparatus comprising:
    a pattern data generating unit that generates test pattern data for testing a write operation in a memory of the semiconductor integrated circuit, in which a write address for the semiconductor integrated circuit is indicated in the test pattern data; and
    a write unit that writes the test pattern data into a storage area of the semiconductor integrated circuit,
    wherein the pattern data generating unit includes
        an input unit that inputs test target information designating the semiconductor integrated circuit as a test target, and stores the test target information in a storage area of the apparatus;
        an operation-target-bit acquiring unit that acquires operation target bit information corresponding to the test target information stored in the storage area of the apparatus from a definition table, the definition table associating LSI-identifying information that identifies the semiconductor integrated circuit with bit-specifying information that specifies an operation target bit of the memory; and
        a merge unit that merges an operation condition for the operation target bit information, which is acquired from an operation condition table that sets the operation condition for all of the bits of the memory, with a non-operation condition table that contains address information of all of the bits and in which a non-operation condition is set for all of the bits.

2. The apparatus according to claim 1,
    wherein the merge unit deletes data of one or more bits other than the operation target bits from the merged non-operation condition table.

3. The apparatus according to claim 1, wherein the operation-target-bit acquiring unit acquires default target bit information from the definition table when the operation target bit corresponding to the test target information cannot be acquired from the definition table, and
    the merge unit acquires from the operation condition table an operation condition corresponding to the default target bit information, and merges the operation condition corresponding to the default target bit information with the non-operation condition table.

4. The apparatus according to claim 3, wherein the pattern data generating unit generates the test pattern data for plural of the semiconductor integrated circuits.

5. The apparatus according to claim 1, wherein
    the storage area is provided in a One Time Programmable memory of the semiconductor integrated circuit, and
    the semiconductor integrated circuit includes a memory test control unit that performs a memory test using the test pattern data written in the storage area and the write address indicated in the test pattern data.

6. A method of testing a semiconductor integrated circuit by causing a computer to perform:
    generating test pattern data for testing a write operation in a memory of the semiconductor integrated circuit, in which a write address for the semiconductor integrated circuit is indicated in the test pattern data; and
    writing the test pattern data into a storage area of the semiconductor integrated circuit, wherein the generating the testpattern data includes
inputting test target information designating the semiconductor integrated circuit as a test target into the computer;
storing the test target information in a storage area of the computer;
acquiring operation target bit information corresponding to the test target information stored in the storage area of the apparatus from a definition table, the definition table associating LSI-identifying information that identifies the semiconductor integrated circuit with bit-specifying information that specifies an operation target bit of the memory;
acquiring an operation condition for the operation target bit information from an operation condition table in which an operation condition is set for all of the bits of the memory; and
merging the operation condition for the operation target bit with a non-operation condition table that contains address information of all of the bits and in which a non-operation condition is set for all of the bits.

7. The method according to claim 6, wherein
the storage area is provided in a One Time Programmable memory of the semiconductor integrated circuit, and
the semiconductor integrated circuit includes a memory test control unit that performs a memory test using the test pattern data written in the storage area and the write address indicated in the test pattern data.

8. A non-transitory computer-readable recording medium having a computer-executable program for causing a computer to function as an apparatus for testing a semiconductor integrated circuit,
the computer including:
a first storage area in which test target information designating the semiconductor integrated circuit as a test target is stored; and
a second storage area in which a non-operation condition table, an operation condition table, and a definition table are stored, wherein
the non-operation condition table includes address information of all of the bits of a memory of the semiconductor integrated circuit and sets a non-operation condition for all of the bits,
the operation condition table sets an operation condition for all of the bits, and
the definition table associates LSI-identifying information that identifies the semiconductor integrated circuit with bit-specifying information that specifies an operation target bit of the memory,
the computer-executable program causing the computer to perform acquiring operation target bit information corresponding to the test target information stored in the first storage area from the definition table;
acquiring an operation condition for the operation target bit information from the operation condition table;
merging the operation condition for the operation target bit information with the non-operation condition table in order to generate test pattern data; and
writing the test pattern data into a storage area of the semiconductor integrated circuit.

9. The recording medium according to claim 8, wherein the merging includes deleting data of one or more bits other than the operation target bits from the merged non-operation condition table.

10. The recording medium according to claim 8, wherein the acquiring the operation target bit information includes acquiring default target bit information from the definition table when the operation target bit information corresponding to the test target information cannot be acquired from the definition table, and
the merging includes acquiring an operation condition for the default target bit information from the operation condition table, and merging the operation condition for the default target bit information with the non-operation condition table.

* * * * *